United States Patent
Endriz et al.

(10) Patent No.: US 6,424,667 B1
(45) Date of Patent: Jul. 23, 2002

(54) SOLDER AND MATERIAL DESIGNS TO IMPROVE RESISTANCE TO CYCLING FATIGUE IN LASER DIODE STACKS

(75) Inventors: John G. Endriz; Jose Chan, both of Belmont; Edmund L. Wolak, Palo Alto; G. Rainer Dohle, San Jose, all of CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/205,910

(22) Filed: Dec. 4, 1998

(51) Int. Cl.$^7$ ................................................ H01S 5/22
(52) U.S. Cl. ........................................................ 372/36
(58) Field of Search ............................................ 372/36

(56) References Cited

U.S. PATENT DOCUMENTS

| | | | |
|---|---|---|---|
| 5,812,570 A | | 9/1998 | Spaeth .......................... 372/36 |
| 5,920,584 A | * | 7/1999 | Dohle et al. ................... 372/36 |
| 6,160,644 A | * | 12/2000 | Lin .............................. 358/518 |

OTHER PUBLICATIONS

TI creates 'Silvar' for GaAs packages, by Ashok Bindra, press release, Electronic Engineering times; Jan. 2, 1996, Plainville, Mass.

"The Basics of Soldering," by Armin Rahn, John Wiley & Sons, Inc. 1993 New York, pp. 8–13, 26–31, 52–55, and 167–173 (No Month).

"Modern Solder Technology for Competitive Electronics Manufacturing," by Jennie S. Hwang, Ph.D., McGraw–Hill, 1996 New York, pp. 357–364 and 510–541 (No Month).

* cited by examiner

*Primary Examiner*—James W. Davie
(74) *Attorney, Agent, or Firm*—David N. Lathrop, Esq.; Gallagher & Lathrop

(57) ABSTRACT

Laser modules that are operated intermittently are prone to stop operating after only a few thousand cycles or less. The laser modules sometimes experience a significant increase in operating temperature before they stop operating and, in some cases, manifest an opening of the electrical circuit that connects the laser diodes in the stack of laser subassemblies. In extreme cases, the laser module disintegrates into component subassemblies. These problems arise from structural failures in affixing agents like solder that are used to affix component parts to each other. The structural failures are caused by cyclical thermal expansion and contraction of component parts that exceed the elastic limit of the solder. Resistance to global plastic deformation (creep) and to local plastic deformation (fatigue) is improved by selecting materials to reduce mechanical strain and increase resistance to creep and fatigue, by altering the structural design of the laser module to reduce mechanical strain induced into the affixing agents, and by altering operational practices to reduce the range of temperatures imposed on laser module components. One design method improves resistance to creep and fatigue by controlling the thickness of the affixing agents used to affix component parts to each other.

49 Claims, 9 Drawing Sheets

SOLDER AND MATERIAL DESIGNS TO IMPROVE RESISTANCE TO CYCLING FATIGUE IN LASER DIODE STACKS

FEDERALLY SPONSORED RESEARCH AND DEVELOPMENT

The invention disclosed herein was supported under Government Contract No. MDA 972-94-3-0020 through the Defense Advance Research Projects Agency. The U.S. government has certain rights in this invention.

TECHNICAL FIELD

The present invention is generally related to the construction of semiconductor-laser modules and is more particularly related to the manner in which components of a semiconductor-laser module are affixed to one another so that resistance to fatigue is improved.

BACKGROUND ART

In some applications such as in laser printers and copiers, laser machining and in optical communication systems, lasers are operated intermittently in cycles with periods of several seconds or longer, perhaps several hours or even several days.

One type of laser module that is used in communications to pump rare-earth solid-state lasers includes an array or "stack" of laser subassemblies that are each affixed by some affixing agent to a substrate of electrical insulating material. In many embodiments, the laser subassemblies are soldered to the substrate, which in turn is soldered to a heat-dissipating component that stabilizes the operating temperature of the laser module. The heat-dissipating component may be a passive heat sink or it may be an active component such as a thermo-electric cooler or a liquid-coolant structure.

In one particular embodiment, each laser subassembly includes a rectangular prism or bar of semiconductor-diode laser material that is soldered lengthwise to a support member that provides the laser diode bar with structural support as well as an electrical contact to one side of the diode. The opposite side of the laser diode is coupled electrically to the support member of an adjacent laser subassembly in the stack by a plurality of wires along the length of the bar. These wires provide a plurality of parallel electrical connections between the opposite side of the laser diode bar and the support member of an adjacent laser subassembly. The laser diodes in the subassemblies of the stack are electrically coupled to one another in series.

Unfortunately, an unacceptably large number of laser modules that are operated intermittently stop operating after only a few thousand cycles or less. The laser modules sometimes experience a significant increase in operating temperature before they stop operating. In some cases, there is an opening of the electrical circuit that connects the laser diodes in the stack of laser subassemblies. In extreme cases, there is disintegration of the laser module into component subassemblies.

Several causes have been suspected and investigated. Empirical studies by the inventors have determined that the cause is a failure in the affixing agent used to affix components of the laser module to each other, particularly in a layer of solder used in many embodiments to affix laser subassemblies to the substrate and cooler. Furthermore, they have determined that this fatigue is a result of cyclical stress applied to the solder by unequal thermal expansion and contraction of the substrate and laser subassemblies as the laser module heats and cools from intermittent operation.

DISCLOSURE OF INVENTION

It is an object of the present invention to improve resistance to cycling fatigue in laser-diode stacks.

According to one aspect of the present invention, a method for designing a laser module comprises specifying a temperature range, specifying one or more materials from which two component of the laser module are to be made and specifying an affixing agent, specifying a structure in which the two component parts are affixed to each other by the affixing agent having a specified thickness, obtaining a measure of reliability for affixation of the two component parts as a function of the specified thickness, the specified structure, coefficients of thermal expansion of the one or more specified materials, and the specified temperature range, wherein the measure of reliability is obtained by estimating strain induced in the affixing agent by differences in thermal expansion of the two component parts across the temperature range, and adjusting the specified thickness of the affixing agent to obtain an acceptable measure of reliability. This method may be conveyed on a medium readable by a machine and embodying a program of instructions for execution by the machine to perform the method.

According to another aspect of the present invention, a laser module comprises a first component part made of a first material having a first coefficient of thermal expansion that is affixed by an affixing agent having a specified thickness to a second component part made of a second material having a second coefficient of thermal expansion, wherein the specified thickness of the affixing agent is established by a method that obtains a measure of reliability for affixation of the component parts as a function of the specified thickness of the affixing agent, the first and second coefficients of thermal expansion, and a specified temperature range, wherein the measure of reliability is obtained by estimating strain induced in the affixing agent by differences in thermal expansion of the component parts across the temperature range, and adjusts the specified thickness of the affixing agent to obtain an acceptable measure of reliability.

According to an aspect of the present invention, a laser module comprises a substrate of electrically insulating but thermally conducting material, and a laser subassembly comprising a bar of laser-semiconductor material that is affixed to the substrate by solder, wherein the solder has a thickness that is sufficiently great to obtain an affixation of the laser subassembly to the substrate with a measure of fatigue life exceeding about 80,000 cycles of strain caused by differences in thermal expansion of the substrate and the laser subassembly across a specified temperature range in which the laser module is designed to operate.

According to another aspect of the present invention, a method for manufacturing a laser module comprises forming a substrate of electrically insulating but thermally conducting material, forming a laser subassembly comprising a bar of laser-semiconductor material, and affixing the laser subassembly to the substrate with an affixing agent having a controlled thickness, wherein the method controls the thickness of the affixing agent to be substantially equal to or greater than a value derived from a design method that predicts reliability for affixation of the substrate and the laser subassembly as a function of the thickness.

The various features of the present invention and its preferred embodiments may be better understood by referring to the following discussion and the accompanying drawings in which like reference numerals refer to like elements in the several figures. The contents of the following discussion and the drawings are set forth as examples only

MODES FOR CARRYING OUT THE INVENTION

Overview

Figure 1:
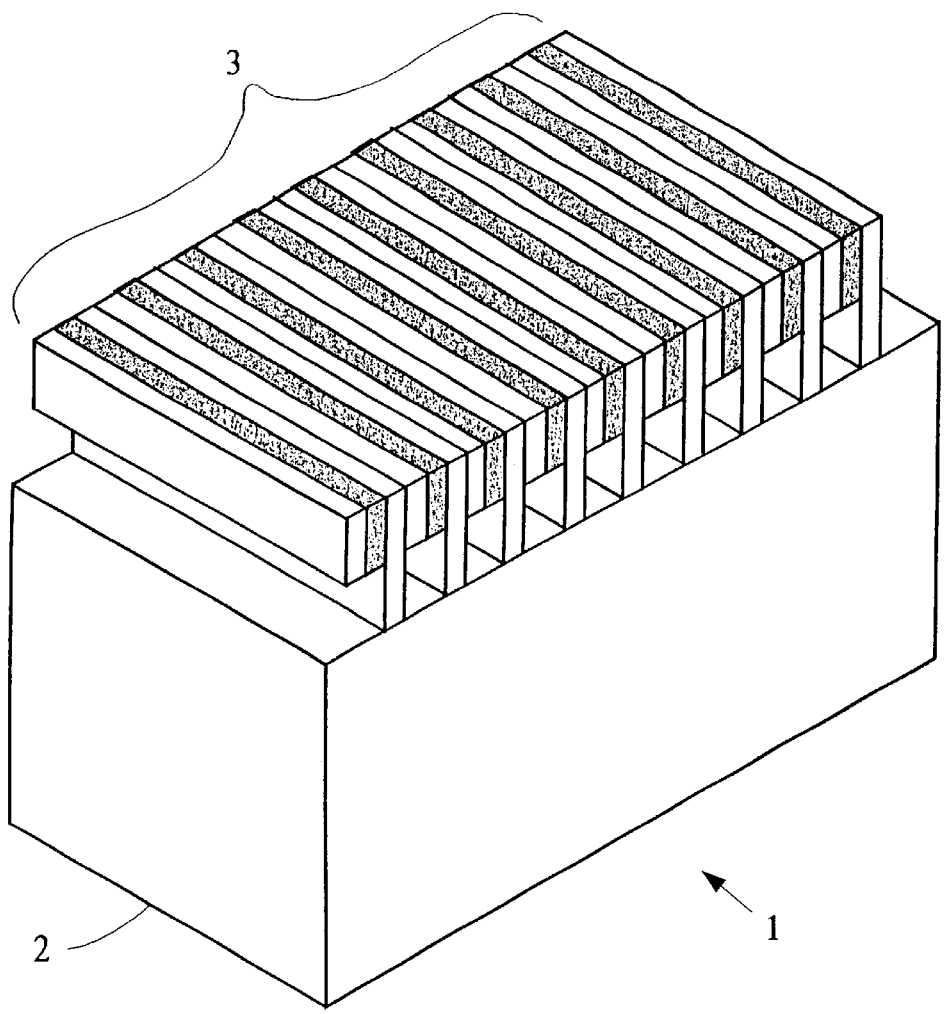
FIG. 1 is a schematic illustration of a laser module comprising an array or stack of laser subassemblies that are affixed to a cooler.

FIG. 1 is a schematic illustration of one embodiment of a laser module 1 that comprises an array or stack 3 of laser subassemblies affixed to substrate 2. In the embodiment shown, each laser subassembly comprises a semiconductor laser diode. Some components required for practical embodiments of a laser module such as electrical terminals or mounting brackets are omitted from the figure for illustrative clarity.

Some component is often required to dissipate the heat generated by the laser diodes in the stack during operation. This may be accomplished in a variety of ways including heat sinks, forced air, thermoelectric cooling devices and liquid coolant. Substrate 2 shown in the figure is suggestive of a "cooler" made of some thermally conductive material such as copper in which microscopic channels are formed to carry a coolant such as water. Tubing required to carry coolant to and from the cooler is not shown. Throughout this disclosure, references to the term "cooler" should be understood to refer generally to essentially any heat-dissipating component.

First and Second Embodiments of a Laser Subassembly

Figure 2A:
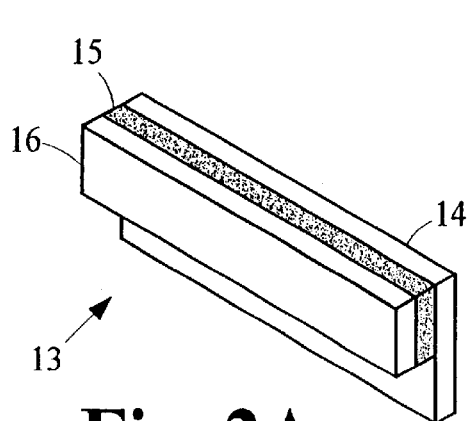
FIGS. 2A and 2B are schematic perspective illustrations of two embodiments of a laser subassembly.
Figure 2B:
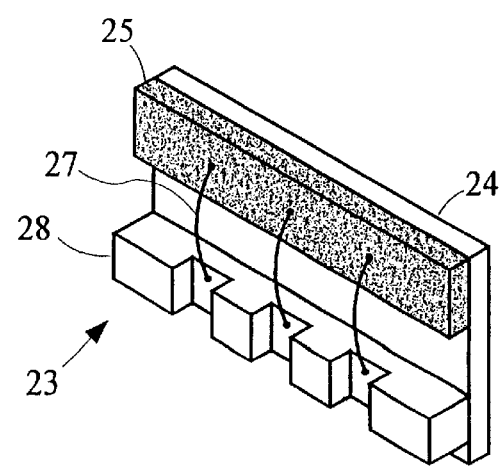

FIGS. 2A and 2B are schematic perspective illustrations of two embodiments of a laser subassembly. The relative dimensions of the component parts of the embodiments in these and other figures are not necessarily shown to scale.

The first embodiment shown in FIG. 2A comprises a laser diode 15 in the shape of a bar made of a semiconductor material such as gallium arsenide (GaAs) affixed to support member 14 made of a material such as copper (Cu), copper-tungsten (CuW) or copper-molybdenum (CuMo) that is both electrically and thermally conductive. A bar 16 of electrically conductive material such as Cu or Mo is affixed to the opposite side of laser diode 15. Preferably, bar 16 is also thermally conductive. This first embodiment of laser subassembly 10 is convenient for manufacturing because it allows laser diode 15 to be tested prior to assembly into a diode stack. Support member 14 and bar 16 provide electrical contacts to the cathode and anode of laser diode 15 and they protect the brittle laser diode 15 against breakage during testing and assembly processes.

Figure 3A:
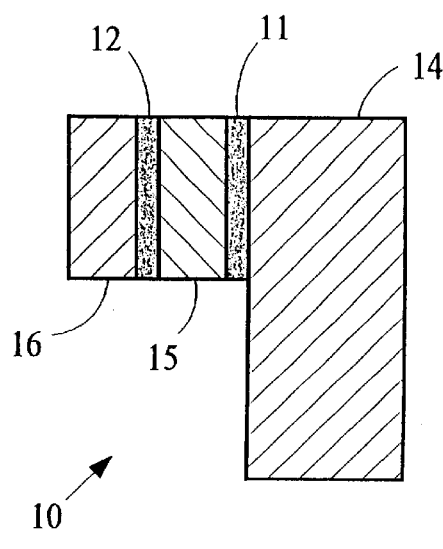
FIGS. 3A and 3B are schematic cross-section illustrations of two embodiments of a laser subassembly.
Figure 4A:
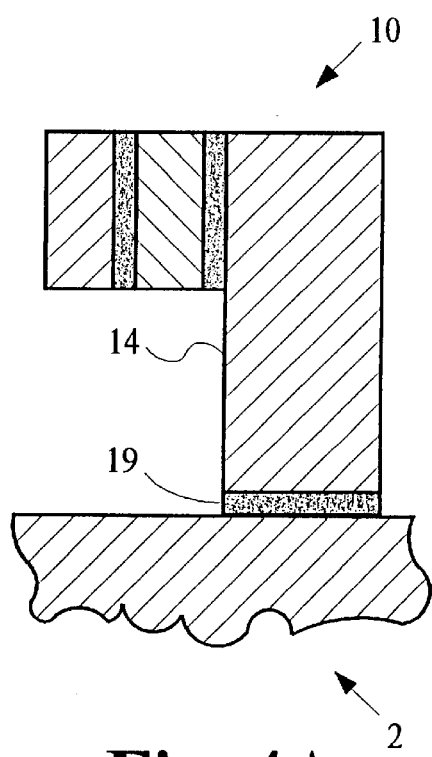
FIGS. 4A and 4B are schematic cross-section illustrations of two embodiments of a laser subassembly affixed to a substrate.

FIG. 3A is a schematic cross-section illustration of the first embodiment of laser subassembly 10. Laser diode 15 is affixed to support member 14 by affixing agent 11, such as a layer of solder. Bar 16 is affixed to the opposite side of laser diode 15 by affixing agent 12, such as a layer of solder. FIG. 4A is a schematic cross-section illustration of the first embodiment of laser subassembly 10 in which support member 14 is affixed to substrate 2 by affixing agent 19, such as a layer of solder. If solder is used as affixing agent 19, a solderable material such as Cu may need to be formed on substrate 2 by some process such as vapor deposition, for example. If solder is also used as affixing agents 11 and 12, it is preferable to use solders for affixing agents 11 and 12 that have a higher melting temperature than that for affixing agent 19.

The second embodiment shown in FIG. 2B comprises a laser diode 25 in the shape of a bar made of a semiconductor material such as GaAs affixed to support member 24 made of a material such as Cu, CuW or CuMo that is both electrically and thermally conductive. A plurality of wires 27 are bonded to the surface of laser diode 25 and are bonded to depressions in a metalized surface of bar 28, which is made of an electrically insulating material such as beryllium oxide (BeO) or Aluminum Nitride (AlN) affixed to support member 24. This second embodiment of laser subassembly 20 allows laser diode 25 to be tested prior to assembly into a diode stack. Support member 24 and the metalized surface of bar 28 provide electrical contacts to laser diode 25. Support member 24 also protects the brittle laser diode 25 against breakage during testing and assembly processes.

Figure 3B:
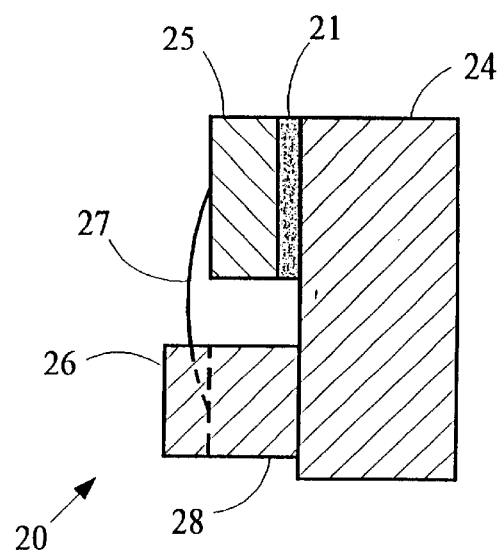
Figure 4B:
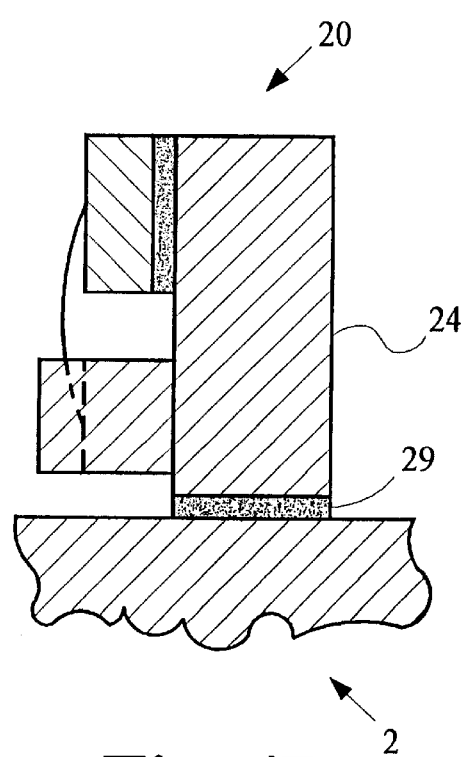

FIG. 3B is a schematic cross-section illustration of the second embodiment of laser subassembly 20. Laser diode 25 is affixed to support member 24 by affixing agent 21, such as a layer of solder. The manner in which bar 28 is affixed to support member 24 is not shown in the figure for illustrative clarity. A variety of affixing agents such as solder or an epoxy cement may be used. FIG. 4B is a schematic cross-section illustration of the second embodiment of laser subassembly 20 in which support member 24 is affixed to substrate 2 by affixing agent 29, such as a layer of solder. If solder is used as affixing agent 29, a solderable material such as Cu may need to be formed on substrate 2 by some process such as vapor deposition, for example. If solder is also used as affixing agent 21, it is preferable to use a solder for affixing agent 21 that has a higher melting temperature than that for affixing agent 29.

Stack of Laser Subassemblies

Figure 5A:
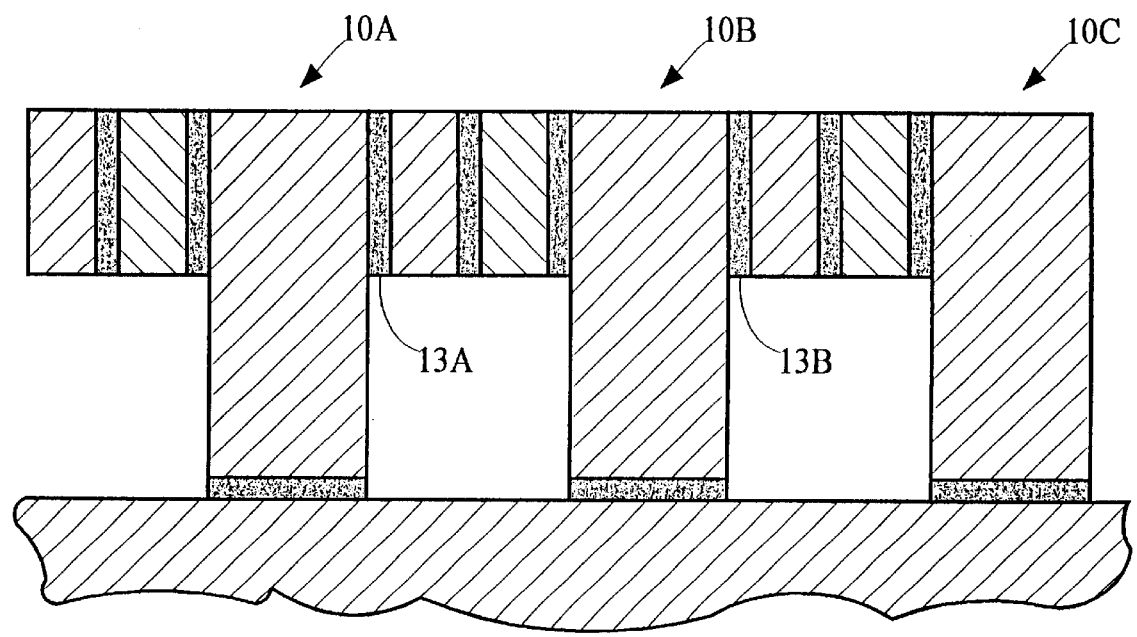
FIGS. 5A and 5B are schematic cross-section illustrations of two embodiments of a plurality of laser subassemblies affixed to a substrate.

A schematic cross-section of a stack comprising laser subassemblies according to the first embodiment is shown in FIG. 5A. Each subassembly 10 is affixed to substrate 2 by its respective support member 14, which can conduct heat from its respective laser diode 15 to substrate 2. The bar 16 in one subassembly 10B is electrically coupled to support member 14 of adjacent subassembly 10A by affixing agent 13A so that the diode stack forms a series connection of the laser diodes 15 in all of the laser assemblies. Preferably, channels or holes are formed in bar 16 to provide an escape for excess amounts of affixing agent 13. The affixation of each subassembly 10 to substrate 2 should not create an electrically conductive path that shorts the laser diodes. For example, if a solderable material such as Cu is formed on the surface of substrate 2 so that the support members can be soldered to the substrate, the solderable material should be formed in such a way that no electrically conductive path is formed between support members 14 of the laser subassemblies 10.

Figure 5B:
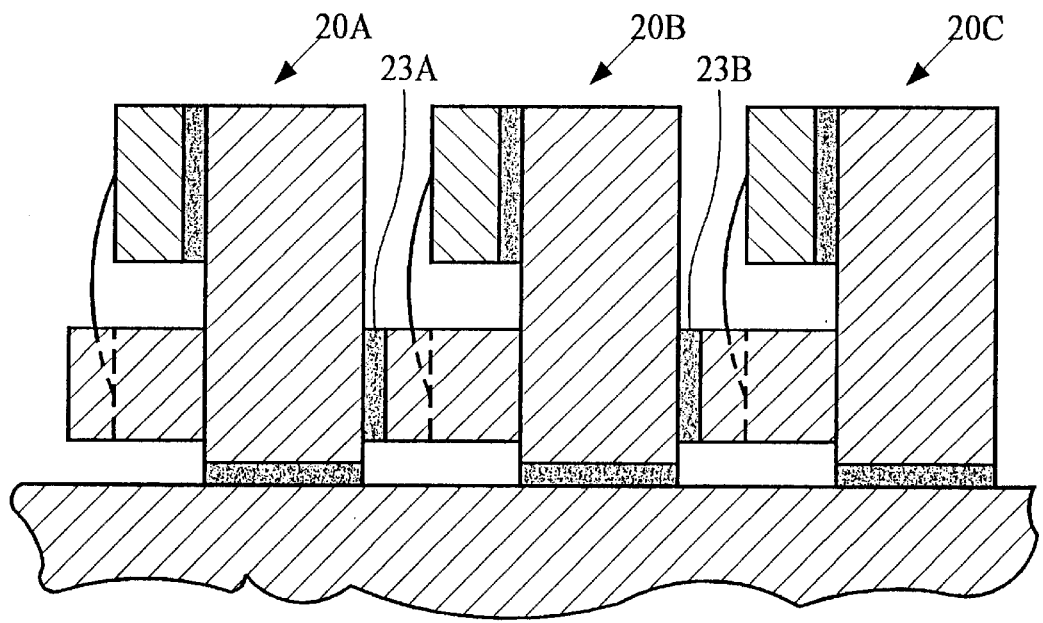

A schematic cross-section of a stack comprising laser subassemblies according to the second embodiment is shown in FIG. 5B. Each subassembly 20 is affixed to substrate 2 by its respective support member 24, which can conduct heat from its respective laser diode 25 to substrate 2. The raised portions of the metalized surface of bar 28 in one laser subassembly 20B is electrically coupled to support member 24 of adjacent subassembly 20A by affixing agent 23A so that the diode stack forms a series connection of the laser diodes 25 in all of the laser assemblies. The manner in which each subassembly 20 is affixed to substrate 2 should not create an electrically conductive path that shorts the laser diodes.

Third Embodiment of Laser Subassembly

It is desirable to make each support of a material such as Cu that is a very good thermal and electrical conductor. If substrate 2 is made of BeO, however, the coefficients of thermal expansion for BeO and Cu do match each other very well. The problem caused by such a mismatch is discussed below. This mismatch can be reduced by making the support members of another material such as CuW. Unfortunately, CuW materials are inferior to Cu as electrical and thermal conductors.

Figure 6:
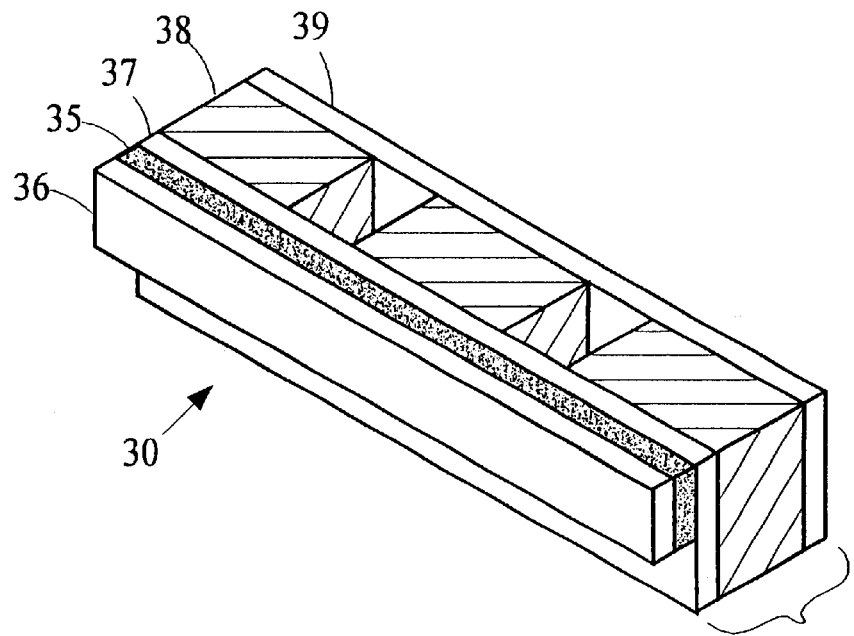
FIG. 6 is a schematic perspective illustration of a third embodiment of a laser subassembly.

FIG. 6 is a schematic perspective illustration of a third embodiment of a laser subassembly that provides support member 34 with the superior conductive properties of some material such as Cu and the preferred coefficient of thermal expansion of another material such as CuW or CuMo. In this embodiment, support member 34 is affixed to one side of laser diode 35 and a bar 36 of electrically conductive material is affixed to the opposite side of laser diode 35. Preferably, bar 36 is also thermally conductive. Support member 34 comprises bars 37 and 39 that are affixed to opposite sides of a plurality of blocks 38. Each block 38 may be formed of a solid material or from individual components such as laminated layers. The lower surfaces of blocks 38 and bars 37 and 39 are arranged to be substantially planar so that all can make good thermal contact with a substrate on which support member 34 is affixed.

The various parts of laser subassembly 30 may be affixed to each other using a variety of affixing agents such as solder. Bars 37 and 39 and blocks 38 in the support member 34 are affixed to a substrate by some affixing agent such as solder. If solder is used to affix the support member 34 to the substrate, a solderable material such as Cu may need to be formed on the substrate. Any solder used to affix other parts of laser subassembly 30 to each other should have a higher melting temperature than the solder used to affix support member 34 to the substrate.

When a stack of laser subassemblies 30 is formed, the laser diodes 35 for the subassemblies are connected in series by affixing bar 36 of one subassembly to bar 39 of an adjacent subassembly. Preferably, channels or holes are formed in bar 36 to provide an escape for excess amounts of the affixing agent used to couple adjacent subassemblies. The affixation of each subassembly 30 to the substrate should not create an electrically conductive path that shorts the laser diodes 35.

Laser Module Failure

Overview

As mentioned above, an unacceptably large number of laser modules such as laser module 1 that are operated intermittently stop operating after only a few thousand cycles or less. The laser modules sometimes experience a significant increase in operating temperature before they stop operating. In some cases, there is an opening of the series-connected laser diodes in the stack and, in extreme cases, there is disintegration of the laser module.

Several causes have been suspected and investigated. Empirical studies by the inventors have determined that the cause is a failure occurring in an affixing agent used to affix components of the laser module to one another, particularly in the layer of solder used in many embodiments to affix laser subassemblies to the substrate and cooler. Furthermore, they have determined that this failure is not easily detected in normal life-prediction testing or stress screening because it is a result of cyclical stress applied to the solder by unequal amounts of thermal expansion and contraction of the substrate and laser subassemblies as the laser module heats and cools from intermittent operation.

The mechanism underlying these failures and the advantages provided by the present invention apply to all of the affixing agents used to affix the component parts of a laser module to each other. In the following discussion, however, more particular mention is made of affixing agents used to affix laser subassemblies to a substrate.

Figure 7:
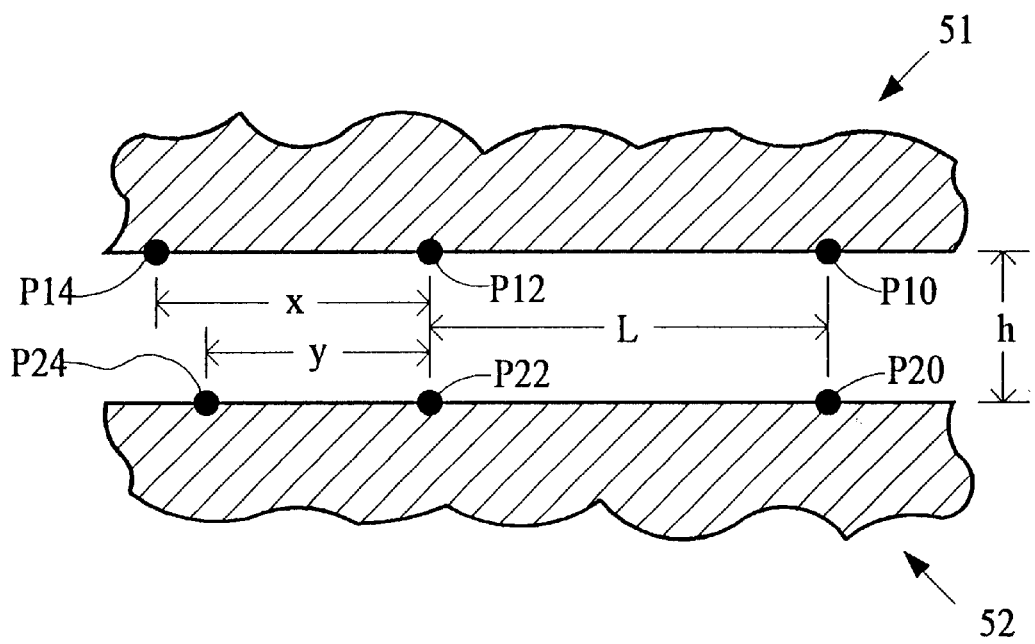
FIG. 7 is a hypothetical schematic illustration of how a change in temperature induces strain in an affixing agent between two components having different coefficients of thermal expansion.

FIG. 7 is a hypothetical schematic illustration of how a change in temperature induces strain in an affixing agent between two components having different coefficients of thermal expansion (CTE). Point P10 represents a "neutral" location on the surface of component 51 that does not move relative to component 52. Similarly, point P20 represents a neutral location on the surface of component 52 that does not move relative to component 51. As the temperature of components 51 and 52 change, point P12 located some distance L from point P10 moves a distance x to location P14 and point P22 located distance L from point P20 moves a distance y to location P24. The distance that each point moves for a change in temperature ΔT may be expressed as:

$$x = \alpha_1 \cdot L \cdot \Delta T \quad (1a)$$

$$Y = \alpha_2 \cdot L \cdot \Delta T \quad (1b)$$

where $\alpha_1$ is the CTE for component 51 and $\alpha_2$ is the CTE for component 52.

If points P12 and P22 are aligned with each other at some temperature $T_1$, the difference between the two distances (x-y) represents a relative movement between the points as the temperature changes. The distance z of this relative movement between the two points for a temperature change $\Delta T$ of both components may be expressed as:

$$z=(x-y)=\alpha_1 \cdot L \cdot \Delta T - \alpha_2 \cdot L \cdot \Delta T = \Delta \alpha \cdot L \cdot \Delta T \quad (2a)$$

Assuming the temperature change $\Delta T$ for components 51 and 52 are the same, if the CTE for the two components are substantially equal, the amount of relative movement between the two points is substantially zero; however, if the difference $\Delta \alpha$ between CTE for the two components is substantial, the amount of relative movement between the two points can be substantial. This relative movement induces a strain into the affixing agent used to affix component 51 to component 52. The amount of strain $\gamma$ can be estimated from the expression:

$$\gamma = \Delta \alpha \cdot L \cdot \Delta T / h \quad (3a)$$

where h is the distance between the affixed components or, expressed alternatively, the thickness of the affixing agent.

It is common in devices like laser module 1, which comprise heat-generating and heat-dissipating components, however, that the temperature change for two affixed components is not the same. The difference in temperature change alters the expansion of the components and it creates a temperature gradient across the affixing agent that is used to affix the two components to each other. The temperature gradient across the affixing agent causes localized areas of plastic deformation, discussed below.

The resultant relative motion between two points may be expressed by a modified form of equation $2a as follows:

$$z=(x-y)=\alpha_1 \cdot L \cdot \Delta T_1 - \alpha_2 \cdot L \cdot \Delta T_2 = L \cdot (\alpha_1 \cdot \Delta T_1 - \alpha_2 \cdot \Delta T_2) \quad (\$2b)$$

where $\Delta T_1$ is the temperature change for component 51 and $\Delta T_2$ is the temperature change for component 52. The strain induced by this relative motion may expressed by a modified form of equation $3a as follows:

$$\gamma = \frac{L \cdot (\alpha_1 \cdot \Delta T_1 - \alpha_2 \cdot \Delta T_2)}{h} \quad (\$3b)$$

Plastic Deformation

Figure 8:
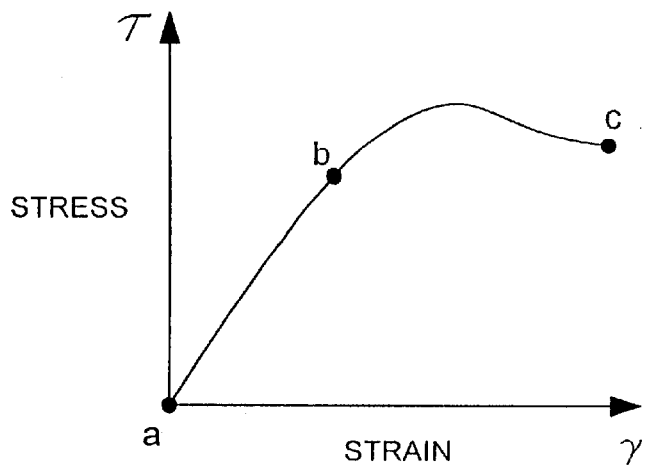
FIG. 8 is a graphical illustration of stress-strain characteristics for a hypothetical material.

The significance of this strain is shown by the curve in FIG. 8, which is a graphical illustration of stress-strain characteristics for a hypothetical material. As increasing stress is applied, the material deforms elastically from a relaxed point a until reaching a "yield point" b where plastic deformation begins. The deformation will continue until the material reaches a breaking point c. The amount of deformation, expressed as a percentage of the original length, is referred to as strain. The elastic portion of strain is reversible because this portion of the deformation does not remain when the stress is removed. The plastic portion of strain is not reversible and represents a permanent deformation that remains after the stress is removed.

The inventors determined that the CTE mismatch, geometry of the components and change in temperature normally encountered in many laser modules are sufficient to cause a plastic deformation of an affixing agent, which can cause the affixing agent to fail by either of two mechanisms. The first mechanism is referred to as "creep" and is a time-dependent deformation of a material when subjected to stress that strains the material beyond its elastic limit. The second mechanism is a structural failure referred to as "fatigue" that results from cyclical application of stress that induces strain beyond the elastic limit. These two mechanisms may interact; however, creep is usually more significant at higher temperatures.

Creep

Creep pertains to a global plastic deformation of a material that is frequently encountered in heat-generating devices like laser modules operating continuously or for extended periods of time. Although creep can occur at any temperature, its effects on solder are usually much greater for temperatures at or above one-half the solder's melting temperature $T_m$ expressed in degrees Kelvin. Temperatures at and above 0.5 $T_m$ are referred to as the high-temperature region and temperatures below 0.5 $T_m$ are referred to as the low-temperature region.

A solder's resistance to creep depends on a number of factors, especially its melting temperature, but ultimately creep resistance is related to the amount of applied stress. An analytical expression of this relationship derived by J. E. Dorn is discussed in Lytlon, Shepard and Dorn, *Trans. AIME*, vol. 212, 1958 p. 220, incorporated herein by reference, and may be expressed as:

$$\dot{\gamma}_P = \gamma_{PO} \tau^n \exp\left(-\frac{\Delta H}{kT}\right) \quad (4)$$

where $\dot{\gamma}_P$=plastic strain rate or creep rate;

$\gamma_{PO}$=kinetics factor related to intrinsic characteristics of the material;

$\tau$=applied stress;

n=stress exponent;

$\Delta H$=activation energy of formation; and k=Boltzman's constant.

For high stress regions and high temperatures, the stress exponent n can exceed 10. For low-stress regions and high temperatures, the stress exponent n may range from about 1.6 to about 2.4, and for very low stress regions, the stress exponent n may equal about 1.

Figure 9:
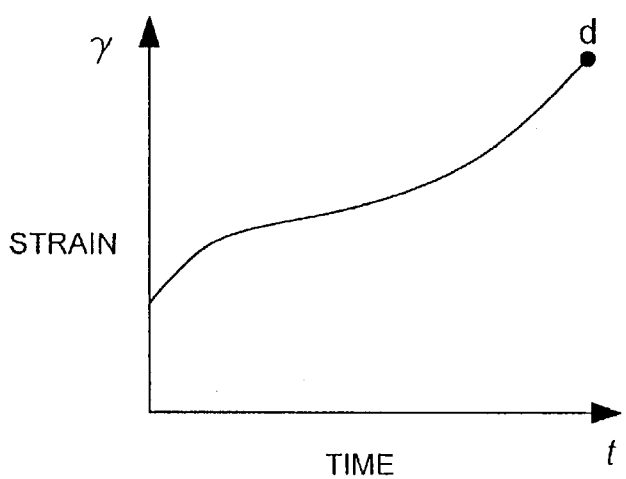
FIG. 9 is a graphical illustration of the creep rate for a hypothetical material.

The curve shown in FIG. 9 is a graphical illustration of the creep rate in the high-temperature region of a hypothetical material. This curve, which expresses strain versus time, usually has an intermediate stage in which the creep rate is substantially constant. If the strain continues long enough, the curve enters a subsequent stage of increasing creep rate until the material fractures at point d. The shape of the creep curve depends on the amount of stress applied and the temperature of the material.

Fatigue

Figure 10:
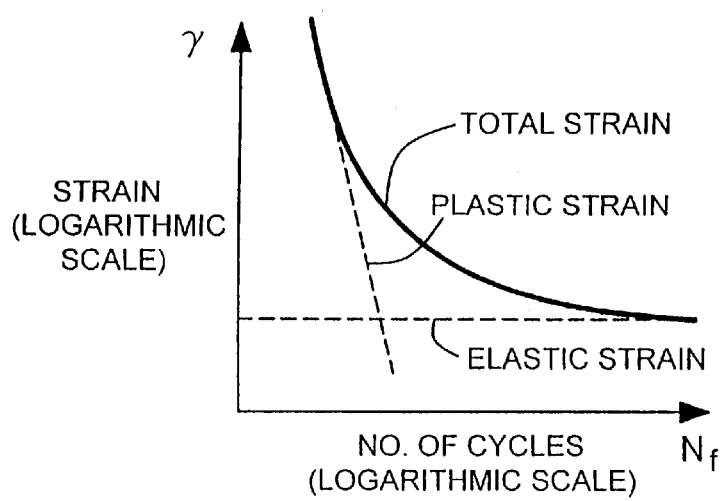
FIG. 10 is a graphical illustration of a fatigue-life curve for a hypothetical material.

Fatigue pertains to localized areas of plastic deformation that can result from temperature gradients within a material. This condition is frequently encountered in a heat-generating device like a laser module during intervals immediately following times when the laser is turned on or turned off FIG. 10 is a graphical illustration of a fatigue-life curve for a hypothetical material.

Obtaining an accurate prediction of fatigue life is extremely difficult because solder joints are complex systems represented by a large number of characteristics that can have interactive effects. Nevertheless, a variety of methods have been developed and new methods are continuing to be developed to predict the fatigue life of a material.

One prediction method is a frequency-modified version of the Coffin-Manson equation that is discussed in Coffin, *Metal Transactions,* vol. 2, 1971, pp. 3105–3113, which is incorporated herein by reference. This equation may be expressed as:

$$N_f \, v^{a-1} = \frac{C}{\Delta \gamma_p^q} \tag{5a}$$

where $N_f$=predicted fatigue life in numbers of cycles;

$v$=frequency;

$\Delta\gamma_P$=cyclic inelastic strain;

$\alpha$=frequency exponent; and

C, q are material constants.

Another prediction method is a strain-range partition methodology that is discussed in Manson, Halford and Hirshberg, "Design for Elevated Temperature Environment," *Trans. of ASME,* 1971, p.250, which is incorporated herein by reference. According to this method, fatigue can be partitioned into four components. The four components are loading plastic strain balanced by unloading plastic strain $\gamma_{pp}$, loading creep strain balanced by unloading plastic strain $\gamma_{cp}$, loading plastic strain balanced by unloading creep strain $\gamma_{pc}$, and loading creep strain balanced by unloading creep strain $\gamma_{cc}$. Fatigue life can be predicted through the interactive rule:

$$\frac{1}{N_f} = \frac{F_{pp}}{N_{pp}} + \frac{F_{cp}}{N_{cp}} + \frac{F_{pc}}{N_{pc}} + \frac{F_{cc}}{N_{cc}} \tag{5b}$$

where is $F_{xy}$ is the fraction of the inelastic strain component xy.

A third prediction method is based on another modification of the Coffin-Manson equation that is discussed in Norris and Landzberg, "Reliability of Controlled Collapse Interconnections," *IBM J. of research and Development,* 13, 1969, p.266, which is incorporated herein by reference. This equation may be expressed as:

$$N_f \, v^{a-1} \exp\left(-\frac{\Delta H}{kT}\right) = \frac{C}{\Delta \gamma_p} \tag{5c}$$

A fourth prediction method is based on Engelmaier's equation, which expresses fatigue life for an arbitrary amount of strain in terms of the fatigue life for a given amount of strain. This method is useful in predicting fatigue life as a function of strain from as few as one empirically determined point that relates fatigue life and strain. For example, by inducing an amount of strain $\gamma_A$ into a component that is higher than anticipated in normal operation, fatigue can be forced to occur after a fewer number of cycles $N_A$ than would be expected during normal operation. The fatigue life $N_f$ to be expected under normal operating strain $\gamma$ can be predicted using the equation $$\frac{N_f}{N_A} = \left(\frac{\gamma_A}{\gamma}\right)^n \tag{5d}$$

where the exponent n is a material constant that, for most soft solders, varies from about 2.5 to about 3.0.

Improved Designs

According to the present invention, improved designs for laser modules increase the resistance of affixing agents to creep and thermal fatigue by selecting materials to reduce mechanical strain and increase resistance to creep and fatigue, by altering the structural design to reduce mechanical strain induced into affixing agents, and by altering operational practices to reduce the range of temperatures imposed on laser module components.

Materials

The materials used to construct the component parts of a laser module may be selected to reduce mechanical strain on the affixing agents used to affix the components, and the affixing agents may be selected having increased resistance to creep and fatigue.

As explained above, mechanical strain can be reduced by selecting materials having more closely matched CTE; however, the selection should also take into account electrical and thermal conductive properties of the materials. Approximate values for the CTE and conductive properties of a few materials are shown in Table I. The materials listed in this and other tables throughout this disclosure are by no means exhaustive and the values that are shown for these materials are only approximations that are provided to help explain principles of the present invention rather than represent precise characteristics of the materials. For example, these values vary as a function of temperature; however, this refinement is not required to explain the principles of the present invention.

TABLE I

| Material | CTE ($10^{-6}$/° C.) | Electrical Conductivity ($10^4$ mho/cm) | Thermal Conductivity (W/mK) |
| --- | --- | --- | --- |
| AlN | 5 | — | 170 |
| $Al_2O_3$ | 7 | — | 25 |
| BeO | 6 | — | 290 |
| Cu | 17 | 59 | 390 |
| Cu-Diamond | 6 to 9 | — | 500 to 1000 |
| Cu(15)Mo(85) | 7 | 53 | 184 |
| Cu(90)/W(10) | 7 | 24 | 210 |
| Diamond | 1 to 2 | — | 1300 to 2400 |
| GaAs | 6 | — | 44 |
| Kovar | 6 | — | 14 |
| Mo | 5 | 18 | 160 |
| Silver | 6 | — | 153 |
| Si | 4 | 9 | 150 |

For example, AlN, $Al_2O_3$ or BeO may be selected to form substrate 2 in the embodiments discussed above because all are good electrical insulators. If Cu is selected to form a cooler, to which substrate 2 is affixed, or to form the support members of the laser subassemblies, however, the use of BeO is more attractive that AlN or $Al_2O_3$ because it is a very good thermal conductor and its CTE is more closely matched to the CTE of Cu. On the other hand, the use of $Al_2O_3$ may be more attractive in GaAs laser modules if its significantly lower thermal conductivity is acceptable because its CTE is more closely matched to the CTE of GaAs, allowing the laser diode to be affixed directly to a substrate formed from this materials. Alternatively, a microchannel cooler made of Silvar (Silver-Kovar) may be a good choice for affixing directly to a GaAs diode since the CTE of these two materials are closely matched. In the embodiments discussed below, BeO is selected to form substrate 2.

The affixing agents used to affix components to each other can be selected according to the agents' resistance to creep and fatigue; however, the selection of agents should take into account the electrical and thermal conductive properties of the agents. For a solder-type affixing agent, additional consideration should be given to the melting temperature of the solder and whether the solder is metallurgically reactive with the components it is to affix.

Approximate values for the CTE, melting temperature and conductive properties of several solders are shown in Table II. As explained above, the values shown in this table are only approximations that are provided to help explain principles of the present invention rather than represent precise characteristics of solders.

TABLE II

| Solder Material | CTE ($10^{-6}$/° C.) | Melting Temp. | Electrical Conductivity ($10^4$ mho/cm) | Thermal Conductivity (W/mK) |
|---|---|---|---|---|
| Ag | 19 | 960.5 | 62.1 | 427 |
| Au | 14 | 1063 | 45.5 | 297 |
| Au(80)Sn(20) | 16 | 278 | | 57 |
| Cu | 17 | 1080 | 59 | 390 |
| In | 32 | 160 | | 82 |
| Pb | 29 | 330 | 5 | 35 |
| Pb(37)Sn(63) | 25 | 183 | 7 | 50 |
| Pt | 9 | 1770 | | 71 |
| Si | 4 | 1430 | | 150 |
| Sn | 22 | 230 | 9 | 66 |
| Sn(96.5)Ag(3.5) | 30 | 221 | 9 | 33 |
| W | 4 | 3410 | | 180 |
| Zn | 30 | 420 | 17 | 116 |

A number of factors should be considered in selecting a solder to affix particular components in a laser module. One important factor is resistance against creep, which depends on a number of factors but is especially dependent on the solder's melting temperature $T_m$. Generally, resistance to creep increases as the melting temperature increases; therefore, consideration should be given to selecting a solder with a high melting temperature.

The melting temperature should be considered in view of the manufacturing steps required to assemble the laser module. For example, for the first embodiment discussed above, one manufacturing process constructs individual laser subassemblies 10 and subsequently affixes the completed subassemblies onto substrate 2. Referring to FIGS. 3A and 4A, this process can be carried out more easily if the melting temperature of the solder for affixing agent 19 is lower than the melting temperatures of the solder for affixing agents 11 and 12. Similarly, the manufacturing process can be carried out more easily if the melting temperature of the solder for affixing agent 19 is lower than the melting temperature of the solder used to affix substrate 2 to a cooler.

Another consideration that may be important is the hardness of the solder that is used to affix adjacent subassemblies to each other. Referring to FIG. 5A for the first embodiment discussed above, for example, this affixation is provided by affixing agents 13A and 13B. The hardness of these affixing agents may be important in manufacturing processes that compress the stack to achieve a precise spacing between adjacent laser subassemblies. Softer solders facilitate this process. Harder solders make it more difficult. As a general rule, harder solders have higher melting temperatures; therefore, the need for controlling the spacing of the laser diodes in a stack may influence the choice of solder by imposing limitations on the melting temperature.

Another important factor is resistance against fatigue, which is difficult to predict accurately. Several prediction methods are mentioned above. By applying these prediction methods to possible solder choices in the context of the operating temperature range, frequency of cycles and the geometry of the components to be affixed to one another, the resistance to fatigue can be assessed for various solders.

Yet another factor is the CTE of the solder itself. A significant mismatch between the CTE of the solder and the CTE of a components that is affixed by the solder can induce thermal stress into the solder at its interface with the component. A technique for reducing the effects of this stress is discussed below.

In view of these factors, materials for implementing the first embodiment of laser module 1 as shown in FIGS. 3A, 4A and 5A may be selected as follows. Laser diode 15 is made of a GaAs bar that is approximately 10 mm long, 1 mm high and 0.15 mm thick. It is affixed by affixing agent 11 to support member 14, which is made of a Cu(90)W(10) or Cu(15)Mo(85) material that is approximately 10 mm long, 1.5 mm high and 0.15 mm thick. Affixing agent 11 is a lead-tin (PbSn) solder that is preferably eutectic Pb(36)Sn(64) or substantially eutectic, e.g., Pb(40)Sn(60). Laser diode 15 is also affixed by affixing agent 12 to bar 16, which is made of Mo that is approximately 10 mm long, 1 mm high and 0.15 mm thick. Affixing agent 12 is the same PbSn solder used for affixing agent 11. The support member 14 for each subassembly is affixed to substrate 2, made of BeO, by affixing agent 19, which is Indium (In) solder. Adjacent subassemblies are affixed to each other by affixing agent 13, which is also Indium solder. If desired, substrate 2 may be affixed to a cooler made of Cu using a PbIn solder or an even higher-temperature temperature melting solder such as a gold-tin (AuSn) solder.

Indium solder is an attractive choice because it provides a good combination of creep resistance, melting temperature, softness, thermal conductivity and electrical conductivity. In addition, the use of Indium solder allows the CuW, CuMo or Mo and Cu components to be soldered without flux under the proper conditions. These conditions may be achieved by depositing Indium solder onto the cleaned surface of the components and then storing these prepared components in an inert atmosphere to retard oxidation on the surface of the Indium solder. When these components are to be soldered, any oxide that does form on the surface can be broken off by pressing the surfaces together prior to applying heat to reflow the Indium solder. Other attractive choices include AgSn and CuSn solders.

Structure

Resistance to creep and fatigue may be increased by altering the structure of the laser module to reduce the mechanical strain that is induced into the affixing agents. This may be accomplished in at least three ways.

Thickness of Affixing Agent

A first way reduces strain by carefully controlling the thickness of the affixing agent used to affix components to each other. Equations 3a and 3b express how thickness effects the amount of strain that is induced into the affixing agent. By increasing the thickness of the affixing agent, the amount of strain can be reduced proportionally; however, this increase in thickness should be controlled to balance the advantages gained by reduced mechanical strain against the disadvantages incurred by decreased thermal and electrical conductivity and decreased physical strength of the affixation. The thermal and electrical conductivity vary inversely with the thickness of the affixing agent.

In terms of reduced strain, the desired thickness can be determined in a variety of ways. For example, the thickness can be set at value that is sufficient to keep mechanical strain substantially within the elastic limit of the affixing agent. Conversely, the thickness can be set at a value that is sufficient to keep mechanical strain substantially outside the range of plastic deformation. Alternatively, the thickness can be increased until the predicted fatigue life is sufficient. Fatigue life may be estimated in a number of ways including the use of the prediction methods mentioned above.

For the specific implementation for the first embodiment described above, a high resistance to fatigue and creep has been obtained by affixing support members 14 to substrate 2 with a layer of Indium solder that is about 40 microns or more thick. Since support member is approximately 10 mm long, this represents a thickness that is about $2.5 \times 10^{-4}$ or more times the length of support member 14. For the specific implementation of the third embodiment described below, a high resistance to fatigue and creep has been obtained by affixing support members 34 to a BeO substrate with a layer of Indium solder that is about 75 microns to about 100 microns thick.

Figure 11A:
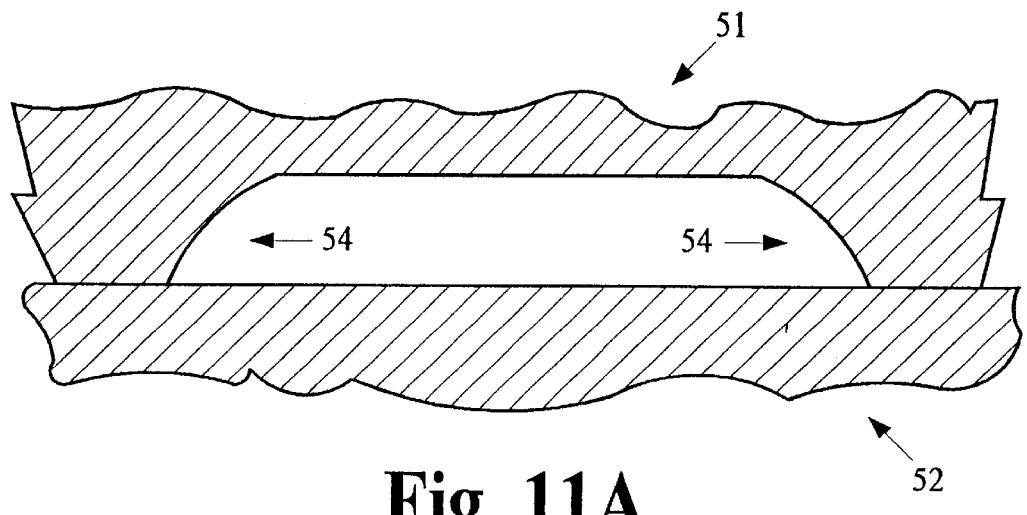
FIGS. 11A through 11C are hypothetical schematic illustrations of a few ways in which the thickness of an affixing agent layer can be controlled.
Figure 11B:
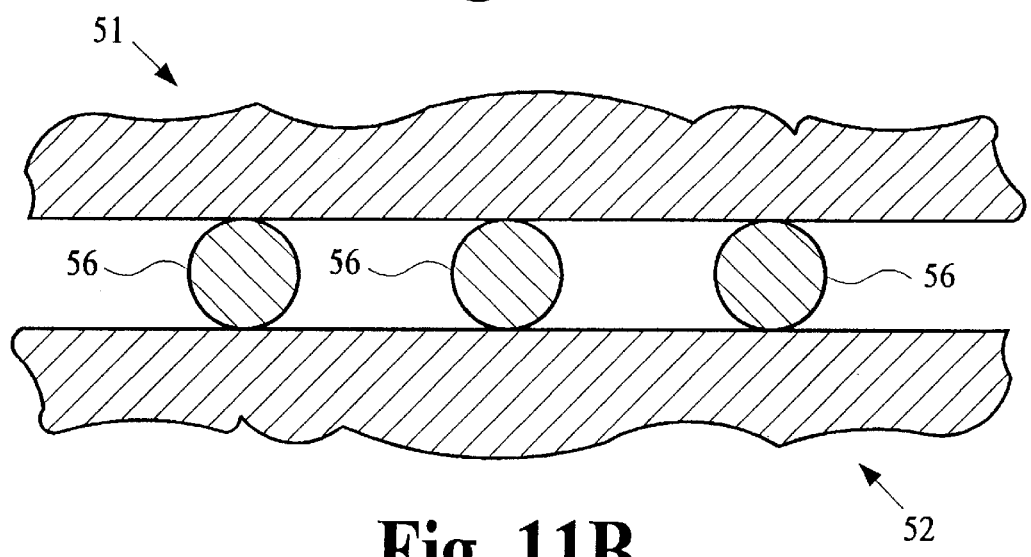
Figure 11C:
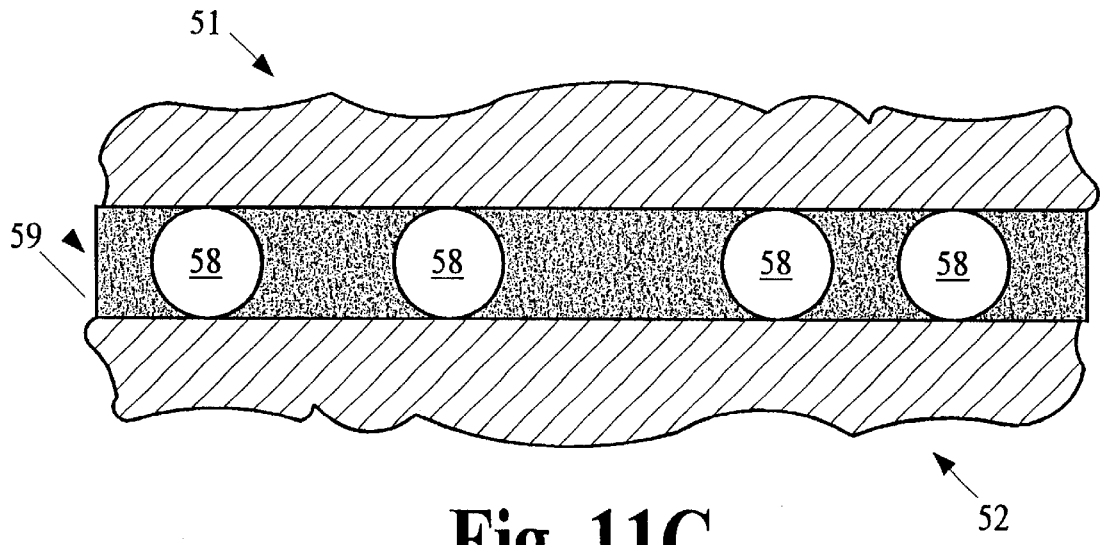

FIGS. 11A through 11C are hypothetical schematic illustrations of a few ways in which the thickness of an affixing agent layer can be controlled. In FIG. 11A, feet 54 formed on the surface of component 51 are used to maintain a space between components 51 and 52 of the proper thickness. Feet may be formed on the surface of component 51 in essentially any manner including deposition and/or etching. In FIG. 11B, spacers 56 of appropriate size are inserted between components 51 and 52 to maintain a proper distance between the components when they are affixed to each other. For example, several short lengths of optical fiber may be suitable for use as spacers 56. These spacers may become bound in the affixing agent and remain as part of the structure, or they may be such that they can be withdrawn after the affixation has taken place. In FIG. 11C, proper spacing between components 51 and 52 is maintained by "pearls" or granules 59 within affixing agent 59.

Structure of Support Member

A second way reduces strain by using a support member that provides sufficient thermal and electrical conductivity yet has an effective CTE that is more closely matched to the CTE of the substrate.

Referring to FIG. 6, a third embodiment of a laser subassembly includes support member 34 with the superior conductive properties of some material such as Cu and the preferred CTE of another material such as CuW. In one specific implementation, support member 34 is affixed to a BeO substrate by Indium solder. The blocks 38 are made of laminated Cu sheets forming blocks that are approximately 0.3 mm thick, 1.5 mm high and 1 mm long. Bars 37 and 39 are made of a Cu(90)W(10) or a Cu(15)Mo(85) material that is approximately 10 mm long, 1.5 mm high and 0.15 mm thick. Bars 37 and 39 are affixed to blocks 38 by a lead-tin (PbSn) solder and are made thin to reduce the electrical and thermal path length between laser diode 35 and blocks 38. By reducing this path length, the electrical and thermal conductive properties of support member 34 are raised to essentially the same level as that for Cu. Because of 0.1 mm gaps between blocks 38, however, the effective CTE of support member 34 is slightly higher but more closely matched to the CTE of bars 37 and 39. The effective CTE of support member 34 is more closely matched to the CTE of the BeO substrate than the CTE of a support member made of Cu, for example. In this manner, the third embodiment provides the thermal and electrical conductive properties of Cu and the thermal expansion characteristics of CuW. Other materials may be used to construct a support member according to this embodiment.

Structure of the Affixing Agent

Figure 12:
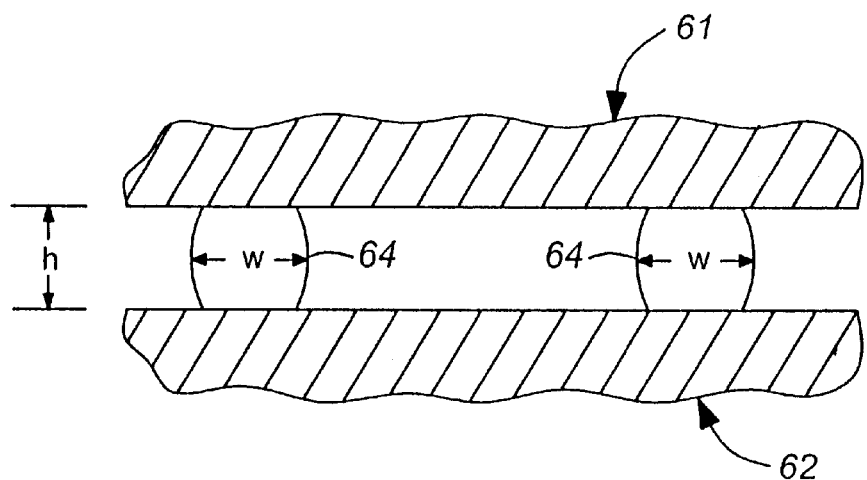
FIG. 12 is a hypothetical schematic illustration of an affixing agent divided into segments to reduce mechanical strain.

Thus far, the discussion of strain in an affixing agent has been limited to that strain which results from differences in thermal expansion between the components that are affixed by the affixing agent. Another source of strain results from differences in thermal expansion between the affixing agent itself and the components that it affixes to each other. The strain induced by CTE mismatch between an affixing agent and the affixed components can be reduced by dividing the affixing agent into segments each having a height h and a width w. This arrangement is illustrated schematically in FIG. 12, in which segments 64 of an affixing agent affix components 61 and 62 to each other. The surface of each segment 64 in the illustration is slightly convex, which is anticipated to be true for many embodiments. The shape may vary greatly for other types of affixing agents such as cements. For this reason, the width w for each segment referred to in this discussion refers to the average width.

The strain induced in each segment of an affixing agent may be estimated from equation 3a, where the length L in the equation corresponds to the width w of the segment. The width of each segment is established to provide an affixation of sufficient reliability. This width may be determined in a variety of ways such as, for example, determining the width that keeps the predicted strain substantially within the elastic limit of the affixing agent or keeping the predicted strain substantially outside the range of plastic deformation. Alternatively, the width can be reduced until the predicted fatigue life is sufficient. A width between about one and two times the height h or thickness of the affixing agent provides good reliability in many embodiments. For example, if the desired thickness for a layer of affixing agent is 40 microns, the affixing agent may be formed in segments that are 40 microns high and about 40 to 80 microns wide.

Operations

Resistance to creep and fatigue may be increased by altering operational practices that reduce the range of temperatures imposed on components in a laser module. This may be accomplished in at least three ways.

A first way reduces temperature variations by shutting off or reducing the cooling effect of a cooler when the laser diodes are not being operated. The cooling effect can be more easily controlled using thermo-electric coolers, for example, rather than coolers that use a liquid coolant or forced air.

A second way reduces temperature variations by reducing bias current to the laser diodes below a threshold level for laser emission rather than shutting off this current. The reduced bias current causes the laser diodes to generate a reduced amount of heat, which moderates the temperature fluctuations in the laser module.

Figure 13:
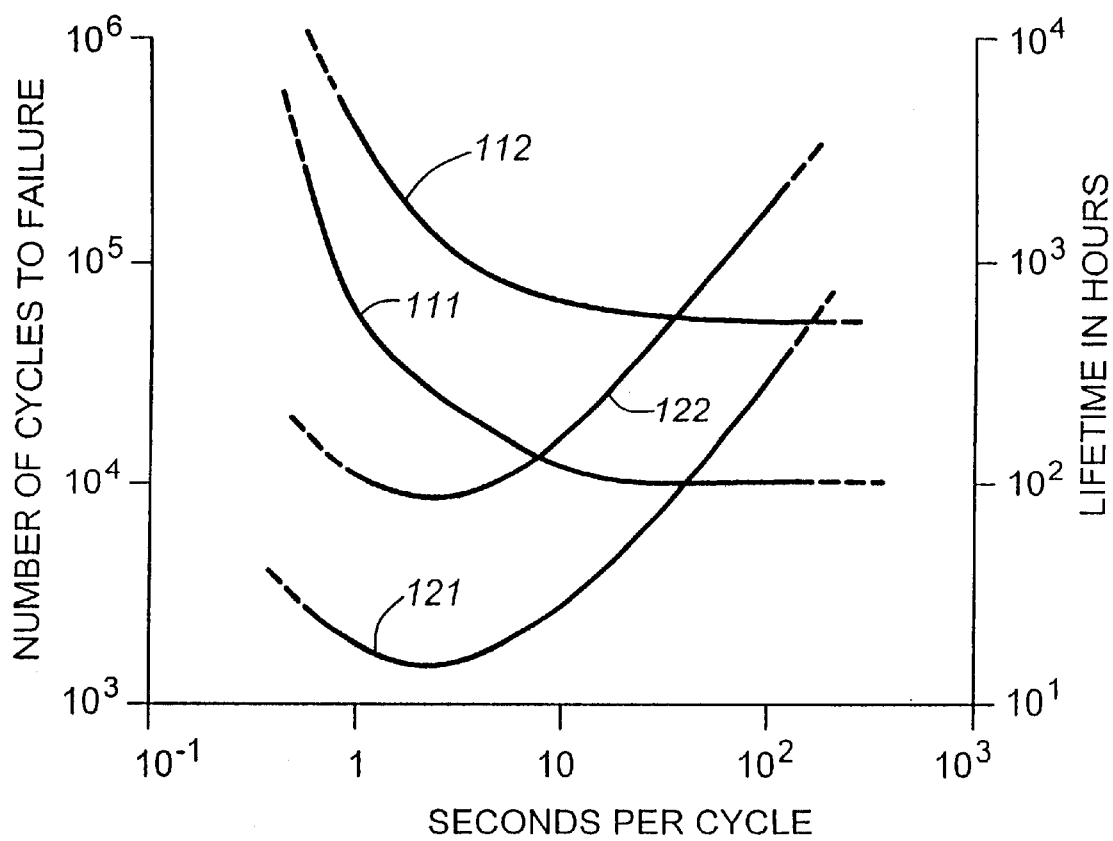
FIG. 13 is a graphical illustration of fatigue life as a function of cycle period.

A third way reduces temperature variations by reducing the period of the operational cycles. FIG. 13 is a graphical illustration of curves that represent fatigue life for two embodiments of a laser module as a function of the length of the period of those cycles. Curve 111 represents the number of cycles before failure for a laser module comprising laser subassemblies according to the implementation of the first embodiment discussed above that has CuW support members bonded to a BeO substrate by a layer of Indium solder that is 20 microns thick. Curve 112 represents the number of cycles before failure for a laser module substantially the same as that for curve 111 except that the layer of Indium solder is 40 microns thick. Curve 121 represents the time before failure for the embodiment corresponding to curve 111, which is obtained from the number of cycles multiplied by the cycle period. Curve 122 represents the time before failure for the embodiment corresponding to curve 112.

Design Method

Figure 14:
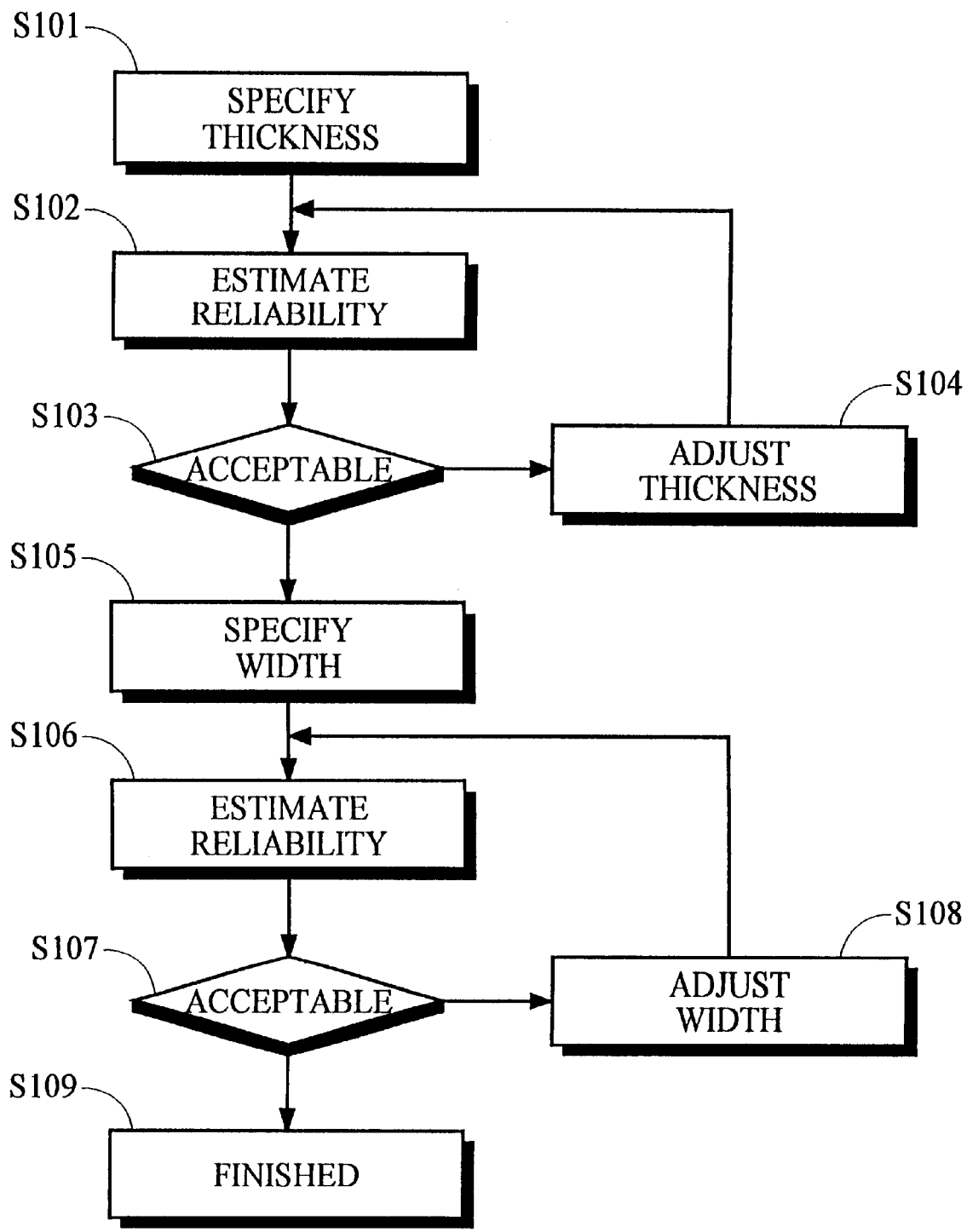
FIG. 14 is a flowchart illustrating steps in a method for designing a laser module according to various aspects of the present invention.

FIG. 14 is a flowchart illustrating steps in a method for designing a laser module according to various aspects of the present invention. In step S101, a thickness of an affixing agent is specified. An estimate of the reliability for the affixation using that thickness is obtained in step S102 using any desirable method such as, for example, predicting the number of cycles before failure or assessing the imposed strain as compared to the limit of elasticity, as discussed above. Step S103 determines if the estimated reliability is acceptable. If it is not, step S104 adjusts the thickness and a new estimate of reliability is obtained in step S102. This reiteration continues until step S103 determines that the estimated reliability is acceptable.

Optionally, the design method may continue with step S105 that specifies the width of affixing agent segments as discussed above. Step S106 obtains an estimate of the reliability for the affixation using the established thickness and the specified width. If the estimated reliability is not acceptable, step S107 causes step S108 to adjust the width and continue with step S106, which obtains a new estimate of reliability. This reiteration continues until step S107 determines that the estimated reliability is acceptable.

Figure 15:
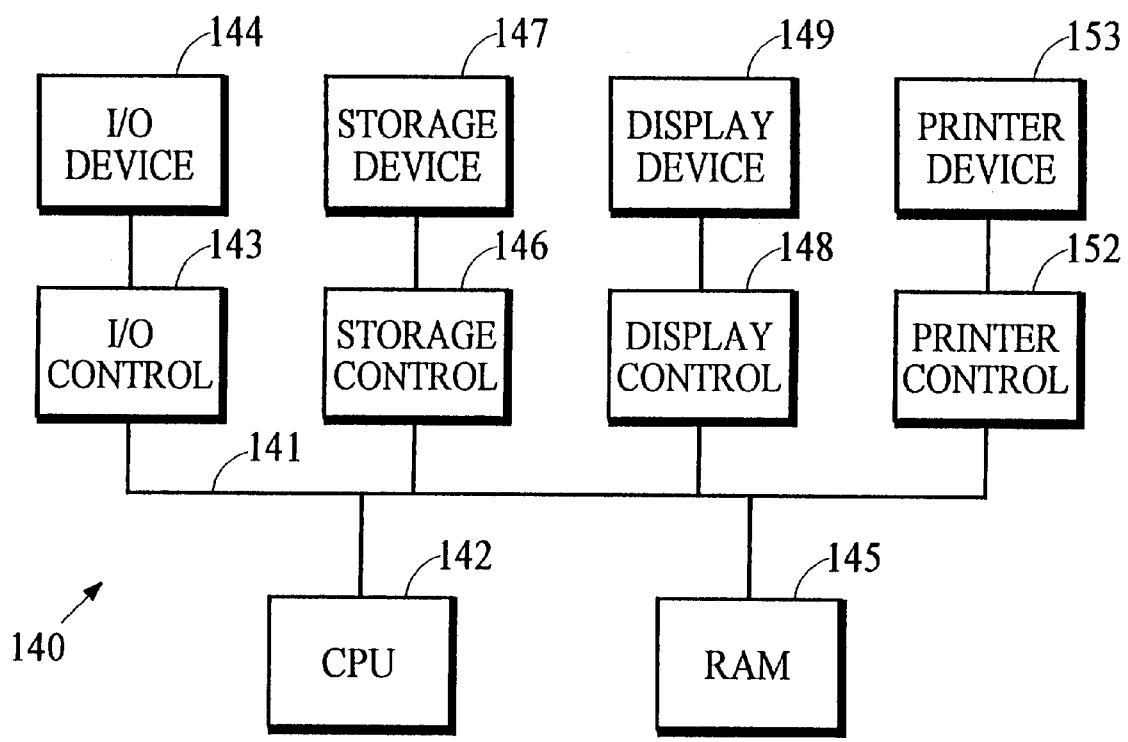
FIG. 15 is a functional block diagram illustrating several components in a typical computer system that is suitable for carrying out various aspects of the present invention.

This design method may be carried out in a variety of ways including the execution of a program of instructions in a general purpose computer. FIG. 15 illustrates the major components of a suitable general purpose computer system 140. CPU 142 provides computing resources. I/O control 143 represents an interface to I/O device 144 such as a keyboard or mouse. RAM 145 is system random access memory (RAM). Storage control 146 represents an interface to storage device 147 that includes a storage medium such as magnetic tape or disk, or an optical medium. The storage medium may be used to record programs of instructions for operating systems, utilities and applications, and may include embodiments of programs that implement various aspects of the present invention. Display control 148 provides an interface to display device 149. Printer control 152 represents an interface to printer device 153 that is an output device like a printer.

In the embodiment shown, all major system components connect to bus 141 which may represent more than one physical bus. For example, some personal computers incorporate only a so called Industry Standard Architecture (ISA) bus. Other computers incorporate an ISA bus as well as a higher bandwidth bus conforming to some bus standard such as the VESA local bus standard or the PCI local bus standard. Preferably, display control 148 connects to a high-bandwidth bus to improve the speed of display. A bus architecture is not required to practice the present invention.

The program of instructions may be stored in storage device 147, copied into RAM 145 and executed by CPU 142. Such software may be conveyed by a variety machine readable medium including magnetic tape, magnetic disk, optical disc, read-only memory (ROM) and baseband or modulated communication paths throughout the spectrum including from supersonic to ultraviolet frequencies.

What is claimed is:

1. A method for designing a laser module comprising two component parts, wherein the method comprises steps that perform the acts of:

specifying an acceptable level of reliability;

specifying a temperature range;

specifying one or more materials from which the two component parts are to be made and specifying an affixing agent;

specifying a structure in which the two component parts are affixed to each other by the affixing agent having a specified thickness;

obtaining a measure of reliability for affixation of the two component parts as a function of the specified thickness, the specified structure, coefficients of thermal expansion of the one or more specified materials, and the specified temperature range, wherein the measure of reliability is obtained by estimating strain induced in the affixing agent by differences in thermal expansion of the two component parts across the temperature range; and comparing the measure of reliability with the acceptable level of reliability to determine if the measure of reliability is acceptable and, if the measure of reliability is not acceptable, adjusting the specified thickness of the affixing agent, obtaining a measure of reliability in response to the adjusted thickness, and reiterating as necessary to obtain an acceptable measure of reliability.

2. A method according to claim 1 wherein the measure of reliability is a number of cycles provided by a fatigue-life prediction method.

3. A method according to claim 2 wherein the fatigue-life prediction method conforms to Coffin-Manson or Engelmaier equations or a strain-range partition method.

4. A method according to claim 1 wherein the affixing agent has a range of elasticity and the acceptable measure of reliability is obtained by adjusting the thickness of the affixing agent such that the estimated strain induced in the affixing agent is substantially within the range of elasticity.

5. A method according to claim 1 wherein the affixing agent has a range of plastic deformation and the acceptable measure of reliability is obtained by adjusting the thickness of the affixing agent such that the estimated strain induced in the affixing agent is substantially outside the range of plastic deformation.

6. A method according to claim 1 wherein the affixing agent has a creep rate that is a function of the estimated strain and the acceptable measure of reliability is obtained by adjusting the thickness of the affixing agent to reduce the strain such that the creep rate is less than a design parameter.

7. A method according to claim 1 wherein the two component parts are affixed to each other by a plurality of segments of the affixing agent each having a width, wherein the measure of reliability is obtained by also estimating strain induced in the plurality of affixations by differences in thermal expansion of one component part and the affixing agent across the temperature range, and wherein the specified structure is modified by also adjusting the width of the plurality of segments to obtain an acceptable measure of reliability.

8. A method according to claim 7 wherein the width is adjusted to be less than or equal to about twice the adjusted specified thickness.

9. A laser module comprising:
a first component part made of a first material having a first coefficient of thermal expansion that is affixed by an affixing agent having a specified thickness to a second component part made of a second material having a second coefficient of thermal expansion;
wherein the specified thickness of the affixing agent is established by a method that:
obtains a measure of reliability for affixation of the component parts as a function of the specified thickness of the affixing agent, the first and second coefficients of thermal expansion, and a specified temperature range, wherein the measure of reliability is obtained by estimating strain induced in the affixing agent by differences in thermal expansion of the component parts across the temperature range; and
adjusts the specified thickness of the affixing agent to obtain an acceptable measure of reliability.

10. A laser module according to claim 9 wherein the measure of reliability is a number of cycles provided by a fatigue-life prediction method that conforms to Coffin-Manson or Engelmaier equations or a strain-range partition method.

11. A laser module according to claim 9 wherein the affixing agent has a range of elasticity and the thickness of the affixing agent is such that the estimated strain induced in the affixing agent is substantially within the range of elasticity.

12. A laser module according to claim 9 wherein the affixing agent has a range of plastic deformation and the thickness of the affixing agent is such that the estimated strain induced in the affixing agent is substantially outside the range of plastic deformation.

13. A laser module according to claim 9 wherein the component parts are affixed to each other by a plurality of segments of the affixing agent each having a width to reduce strain induced in the plurality of affixations by differences in thermal expansion of one component part and the affixing agent across the temperature range.

14. A laser module according to claim 13 wherein the width is less than or equal to about twice the adjusted specified thickness.

15. A laser module comprising:
a substrate of electrically insulating but thermally conducting material; and
a laser subassembly comprising a bar of laser-semiconductor material that is affixed to the substrate by solder, wherein the solder has a thickness that is sufficiently great such that substantially no plastic deformation is induced in the solder by differences in thermal expansion of the substrate and the laser subassembly across a specified temperature range in which the laser module is designed to operate.

16. A laser module according to claim 15 wherein the measure of fatigue life is a number of cycles provided by a fatigue-life prediction method.

17. A laser module according to claim 16 wherein the fatigue-life prediction method conforms to Coffin-Manson or Engelmaier equations or a strain-range partition method.

18. A laser module according to claim 15 wherein the solder has a range of elasticity and the thickness of the solder is such that estimated strain induced in the solder is substantially within the range of elasticity.

19. A laser module according to claim 15 wherein the solder has a range of plastic deformation and the thickness of the solder is such that estimated strain induced in the solder is substantially outside the range of plastic deformation.

20. A laser module according to claim 15 wherein the solder has a creep rate that is a function of the strain and the thickness of the solder is such that the creep rate is low enough to achieve the measure of fatigue life.

21. A laser module according to claim 15 wherein the laser subassembly and the substrate are affixed to each other by a plurality of segments.

22. A laser module according to claim 21 wherein the width is less than or equal to about twice the thickness.

23. A laser module according to claim 15 wherein the laser subassembly comprises an electrically conducting and thermally conducting support member that is affixed to the substrate by the solder, wherein the bar of laser-semiconductor material has a first surface that is affixed to a first side of the support member, and wherein an electrically conductive material is affixed to a second surface of the bar of laser-semiconductor material that is opposite the first surface.

24. A laser module according to claim 23 wherein a plurality of projections extend from the support member to maintain a separation between the support member and the substrate that is sufficient to receive the thickness of solder.

25. A laser module according to claim 23 that further comprises one or more spacers interposed between the laser subassembly and the substrate to maintain a separation between the support member and the substrate that is sufficient to receive the thickness of solder.

26. A laser module according to claim 23 that comprises a plurality of laser subassemblies arranged in proximity to one another on the substrate, wherein the electrically conductive material of a respective laser subassembly is electrically coupled to a second side of the support member of an adjacent laser subassembly that is opposite the first side of that support member.

27. A laser module according to claim 26 wherein, for a respective laser subassembly, the support member comprises
a plurality of blocks of electrically conducting material that are affixed to the substrate and separated from one another,
a first bar of electrically conducting material that is affixed to the plurality of blocks, wherein the first side of the support member is a surface of the first bar that is opposite the plurality of blocks, and
a second bar of electrically conducting material that is affixed to the plurality of blocks opposite the first bar, wherein the second side of the support member is a surface of the second bar that is opposite the plurality of blocks.

28. A laser module according to claim 27 wherein the substrate has a first coefficient of thermal expansion, the plurality of blocks have a second coefficient of thermal expansion that differs from the first coefficient of thermal expansion by a first difference, and the first and second bars have respective coefficients of thermal expansion that differ from the first coefficient of thermal expansion by amounts that are less than the first difference.

29. A laser module according to claim 28 wherein the substrate is made of beryllium oxide or aluminum nitride, the plurality of blocks are made of copper, and the first and second bars are made of copper-tungsten or molybdenum.

30. A laser module according to claim 26 wherein, for a respective laser subassembly having a length, the support member is affixed to the substrate by a layer of indium solder having an average thickness that is equal to or greater than an amount equal to $2.5 \times 10^{-4}$ times the length.

31. A method for manufacturing a laser module comprising steps that perform the acts of:
- forming a substrate of electrically insulating but thermally conducting material;
- forming a laser subassembly comprising a bar of laser-semiconductor material; and
- affixing the laser subassembly to the substrate with an affixing agent having a controlled thickness, wherein the method controls the thickness of the affixing agent to be substantially equal to or greater than a value derived from a design method that predicts reliability for affixation of the substrate and the laser subassembly as a function of the thickness.

32. A method according to claim 31 wherein the measure of reliability is a number of cycles provided by a fatigue-life prediction method.

33. A method according to claim 32 wherein the fatigue-life prediction method conforms to Coffin-Manson or Engelmaier equations or a strain-range partition method.

34. A method according to claim 31 wherein the affixing agent has a range of elasticity and the thickness of the affixing agent is controlled such that estimated strain induced in the affixing agent by differences in thermal expansion of the substrate and the laser subassembly across an operating temperature range is substantially within the range of elasticity.

35. A method according to claim 31 wherein the affixing agent has a range of plastic deformation and the thickness of the affixing agent is controlled such that estimated strain induced in the affixing agent by differences in thermal expansion of the substrate and the laser subassembly across an operating temperature range is substantially outside the range of plastic deformation.

36. A method according to claim 31 wherein the substrate and the laser subassembly are affixed to each other by a plurality of segments of the affixing agent each having a width and the method controls the width of the segments.

37. A method according to claim 36 wherein the width is controlled to be less than or equal to about twice the adjusted specified thickness.

38. A method according to claim 31 that comprises affixing the substrate to a plurality of laser subassemblies arranged in proximity to one another on the substrate.

39. A method according to claim 31 wherein a plurality of projections extend from the support member to maintain a separation between the support member and the substrate that is sufficient to receive the thickness of the affixing agent.

40. A method according to claim 31 that comprises inserting one or more spacers between the laser subassembly and the substrate prior to affixing the substrate to the laser subassembly so that the substrate and support member are separated by a distance sufficient to receive the thickness of the affixing agent.

41. A method according to claim 40 that comprises withdrawing at least some of the spacers from between the laser subassembly and the substrate after the substrate has been affixed to the support member.

42. A medium readable by a machine embodying a program of instructions for execution by said machine to perform a method for designing a laser module, wherein the method comprises:
- specifying an acceptable level of reliability;
- specifying a temperature range;
- specifying one or more materials from which the two component parts are to be made and specifying an affixing agent;
- specifying a structure in which the two component parts are affixed to each other by the affixing agent having a specified thickness;
- obtaining a measure of reliability for affixation of the two component parts as a function of the specified thickness, the specified structure, coefficients of thermal expansion of the one or more specified materials, and the specified temperature range, wherein the measure of reliability is obtained by estimating strain induced in the affixing agent by differences in thermal expansion of the two component parts across the temperature range; and
- comparing the measure of reliability with the acceptable level of reliability to determine if the measure of reliability is acceptable and, if the measure of reliability is not acceptable, adjusting the specified thickness of the affixing agent, obtaining a measure of reliability in response to the adjusted thickness, and reiterating as necessary to obtain an acceptable measure of reliability.

43. A medium according to claim 42 wherein the measure of reliability is a number of cycles provided by a fatigue-life prediction method.

44. A medium according to claim 43 wherein the fatigue-life prediction method conforms to Coffin-Manson or Engelmaier equations or a strain-range partition method.

45. A medium according to claim 42 wherein the affixing agent has a range of elasticity and the acceptable measure of reliability is obtained by adjusting the thickness of the affixing agent such that the estimated strain induced in the affixing agent is substantially within the range of elasticity.

46. A medium according to claim 42 wherein the affixing agent has a range of plastic deformation and the acceptable measure of reliability is obtained by adjusting the thickness of the affixing agent such that the estimated strain induced in the affixing agent is substantially outside the range of plastic deformation.

47. A medium according to claim 42 wherein the affixing agent has a creep rate that is a function of the estimated strain and the acceptable measure of reliability is obtained by adjusting the thickness of the affixing agent to reduce the strain such that the creep rate is less than a design parameter.

48. A medium according to claim 42 wherein the two component parts are affixed to each other by a plurality of segments of the affixing agent each having a width, wherein the measure of reliability is obtained by also estimating strain induced in the plurality of affixations by differences in thermal expansion of one component part and the affixing agent across the temperature range, and wherein the specified structure is modified by also adjusting the width of the plurality of segments to obtain an acceptable measure of reliability.

49. A medium according to claim 48 wherein the width is adjusted to be less than or equal to about twice the adjusted specified thickness.

* * * * *

UNITED STATES PATENT AND TRADEMARK OFFICE
CERTIFICATE OF CORRECTION

PATENT NO. : 6,424,667 B1
DATED : July 23, 2002
INVENTOR(S) : Endriz et al.

It is certified that error appears in the above-identified patent and that said Letters Patent is hereby corrected as shown below:

Column 20,
Lines 3-4, "the two component" should read -- two component --

Signed and Sealed this

Third Day of December, 2002

JAMES E. ROGAN
*Director of the United States Patent and Trademark Office*